United States Patent
Kudelka

(10) Patent No.: US 7,157,382 B2
(45) Date of Patent: Jan. 2, 2007

(54) METHOD FOR EXPANDING A TRENCH IN A SEMICONDUCTOR STRUCTURE

(75) Inventor: Stephan Kudelka, Ottendorf-Okrilla (DE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 11/053,668

(22) Filed: Feb. 9, 2005

(65) Prior Publication Data

US 2005/0176256 A1 Aug. 11, 2005

(30) Foreign Application Priority Data

Feb. 10, 2004 (DE) ............ 10 2004 006 545

(51) Int. Cl.
*H01L 21/461* (2006.01)
*H01L 21/302* (2006.01)

(52) U.S. Cl. ................... 438/745; 438/753

(58) Field of Classification Search ............ None
See application file for complete search history.

(56) References Cited

U.S. PATENT DOCUMENTS

| 6,352,893 | B1 * | 3/2002 | Michaelis et al. ........ 438/248 |
| 6,387,771 | B1 * | 5/2002 | Genz et al. ............ 438/386 |
| 6,559,069 | B1 | 5/2003 | Goldbach et al. |
| 6,677,218 | B1 | 1/2004 | Kirchhoff et al. |
| 2001/0016398 | A1 * | 8/2001 | Kudelka et al. ......... 438/427 |
| 2005/0176198 | A1 * | 8/2005 | Kudelka ................ 438/243 |

* cited by examiner

*Primary Examiner*—Duy-Vu N Deo
(74) *Attorney, Agent, or Firm*—Morrison & Foerster LLP

(57) ABSTRACT

The present invention provides a method for expanding a trench in a semiconductor structure. A trench is provided in a semiconductor substrate, hydrogen-terminated silicon surfaces are provided in the trench, anisotropic wet etching of the silicon surfaces in the trench with an alkaline etchant occur, and the trench is rinsed with a proton-containing neutralizing agent for the removal of the alkaline etchant. Between the wet etching step and the rinsing step, an anodic passivation of the etched silicon surfaces in the trench is carried out, in the course of which an etching stop layer is formed on the etched silicon surfaces in the trench.

10 Claims, 4 Drawing Sheets

METHOD FOR EXPANDING A TRENCH IN A SEMICONDUCTOR STRUCTURE

CLAIM FOR PRIORITY

This application claims the benefit of priority to German Application No. 10 2004 006 545.4, filed in the German language on Feb. 10, 2004, the contents of which are hereby incorporated by reference.

TECHNICAL FIELD OF THE INVENTION

The present invention relates to a method for expanding a trench in a semiconductor structure.

BACKGROUND OF THE INVENTION

Although applicable to arbitrary semiconductor structures, the present invention and also the problem area on which it is based are explained on the basis of trenches for storage capacitors in semiconductor memory devices.

Modern semiconductor memory devices have trench capacitors in order that the individual memory cells comprising the trench capacitor and an associated selection transistor have a least possible space requirement.

Since the capacitance of a trench capacitor is directly proportional to its surface area, the trenches of the trench capacitors are usually expanded by an etching process in the lower region, which results in a desired enlargement of the surface area.

FIGS. 2–4 show process steps of a method for expanding a trench in a semiconductor structure which is disclosed in US 2001/0016398 A1.

In FIG. 2, reference symbol 100 designates a silicon semiconductor substrate with a trench 50 provided therein. Situated on the surface of the silicon semiconductor substrate 100 is a pad stack 110, comprising a lower pad oxide layer 111 and an upper pad nitride layer 112, which have been used as a mask for forming the trench 50. An insulation collar 120 made of silicon, e.g. TEOS oxide, is provided in the upper trench region 154.

The semiconductor structure with the trench 50 shown in FIG. 2 is firstly treated with HF in order to remove natural oxide from the silicon surfaces 150 that are uncovered in the trench 50 and to terminate these silicon surfaces 150 with hydrogen, which remains on the silicon surfaces 150.

The HF treatment is preferably carried out for 60 to 180 seconds in a water/HF solution having a volume ratio of 200:1.

In a subsequent process step, illustrated in FIG. 3, firstly a rinsing with $H_2O$ is effected and then an anisotropic wet etching with alkaline $NH_4OH$ solution is effected, for example in an aqueous solution with a dilution of 100:1.

In this case, the trench 50 is expanded in the lower region 155 lying below the insulation collar 120. The diagrammatic drawing of FIG. 3 does not illustrate the fact that the expansion is effected anisotropically with regard to specific crystal planes in a manner dependent on the crystal orientation of the silicon semiconductor substrate 100.

Furthermore referring to FIG. 4, after a desired expansion has been obtained, the $NH_4OH$ is removed from the trench 50 by rinsing with $H_2O$.

The $H_2O$ rinsing gives rise to problems, however, in so far as dissolved $SiO_2$ precipitates as silica gel as a result of the negative pH shift of the water rinsing and forms complexes which can outdiffuse significantly more slowly than protons of the water rinsing can indiffuse. In other words, these precipitated complexes impede rapid rinsing of the trench 50, which has the effect that the etching in the lower trench region, where new protons can be supplied only slowly, advances in an uncontrolled manner until the complexes have outdiffused.

The mechanisms of the $NH_4OH$ etching and of the subsequent water rinsing are reproduced by the corresponding chemical formulae below.

a) $NH_4OH$ etching of silicon

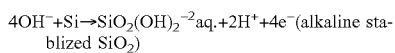

$4e^- + 4H_2O \rightarrow 4OH^- + 2H_2$ b) Water rinsing: negative pH shift→protonation of silica gel→destabilization

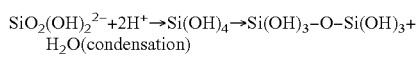

A typical value of the diffusion coefficient for the protons is $12 \times 10^{-9}$ m²s⁻¹ and a typical value of the diffusion coefficient for $SiO_x$ is $0.5 \times 10^{-9}$ m²s⁻¹.

Possible approaches for solving this problem might provide downstream HF etches that bring dissolved $SiO_2$ into solution again. The disadvantage consists in the consumption of $SiO_2$, that is to say also in an attack on the insulation collar 120. The etching rate is not significantly lowered by a dilution of the etching solution, for example 400:1 instead of 100:1. At lower temperatures, although the etching rate decreases, the solubility of $SiO_2$ likewise decreases.

SUMMARY OF THE INVENTION

The present invention provides an improved method for expanding a trench in a semiconductor structure in which the etching process can be better controlled.

According to one embodiment of the invention, there is a method for expanding a trench in a semiconductor structure in which there is provision of the trench in a semiconductor substrate; provision of hydrogen-terminated silicon surfaces in the trench; anisotropic wet etching of the silicon surfaces in the trench with an alkaline etchant; and rinsing of the trench with a proton-containing neutralizing agent for the removal of the alkaline etchant; in which case between the wet etching step and the rinsing step, an anodic passivation of the etched silicon surfaces in the trench is carried out, in the course of which an etching stop layer is formed on the etched silicon surfaces in the trench.

In the invention, between the wet etching step and the rinsing step, an anodic passivation of the etched silicon surfaces in the trench is carried out. This has the advantage that the etching process cannot continue in an uncontrolled manner in the lower trench region when rinsing out the alkaline etchant.

The method according to the invention makes it possible to stop the etching process without changing the pH of the etching chemical. The $SiO_2$ stabilized by $NH_3$ can be removed by comparatively rapid diffusion from the trench. Only afterward is the rinsing with $H_2O$ effected.

The present invention thus makes it possible to decouple the etching process from the concentration of the reactive species by stopping the etching by means of an anodic current pulse which brings about an oxide passivation of the silicon surfaces.

In accordance with one preferred embodiment, the alkaline etchant is $NH_4OH$.

In accordance with a further preferred embodiment, the neutralizing agent is $H_2O$.

In accordance with a further preferred embodiment, the etching stop layer is a silicon oxide layer.

In accordance with a further preferred embodiment, the provision of hydrogen-terminated silicon surfaces in the trench is effected by means of an HF treatment.

In accordance with a further preferred embodiment, the trench has an aspect ratio of at least 5:1.

In accordance with a further preferred embodiment, the trench is expanded in the lower region and is masked in the upper region by means of an insulation collar for protection against the expansion.

In accordance with a further preferred embodiment, the trench is part of a trench capacitor of a semiconductor memory device.

In accordance with a further preferred embodiment, the etching stop layer is removed after rinsing of the trench.

In accordance with a further preferred embodiment, the anodic passivation is formed by a current pulse that is significantly shorter than the etching time.

BRIEF DESCRIPTION OF THE DRAWINGS

The invention is described in more detail below with reference to the exemplary embodiments and illustrated in the drawings.

In the Figures.

In the figures, identical reference symbols designate identical or functionally identical component parts.

DETAILED DESCRIPTION OF THE INVENTION

Figure 1:
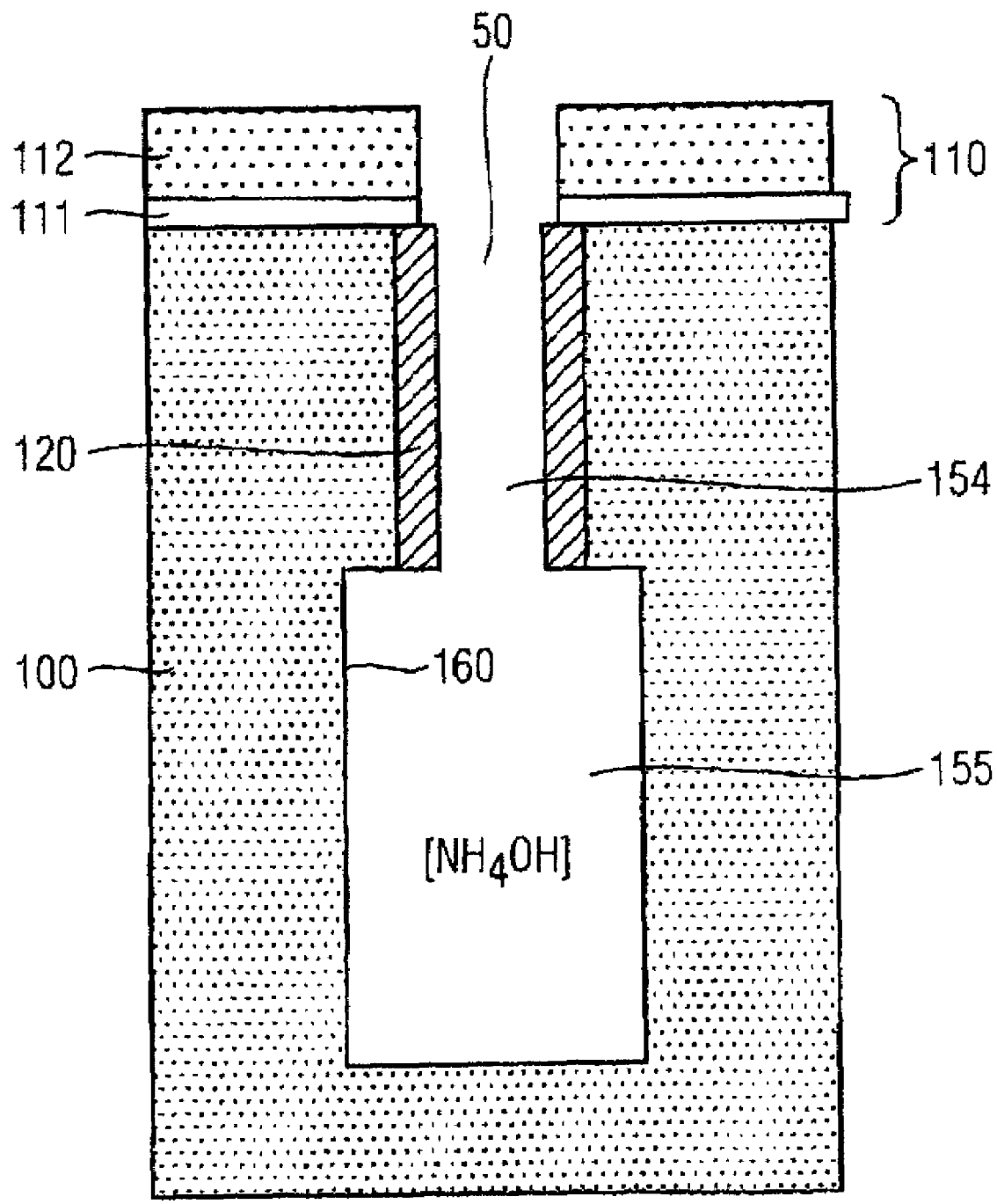
FIG. 1 illustrates a process step of a method for expanding a trench in a semiconductor structure in one embodiment of the present invention.
Figure 2:
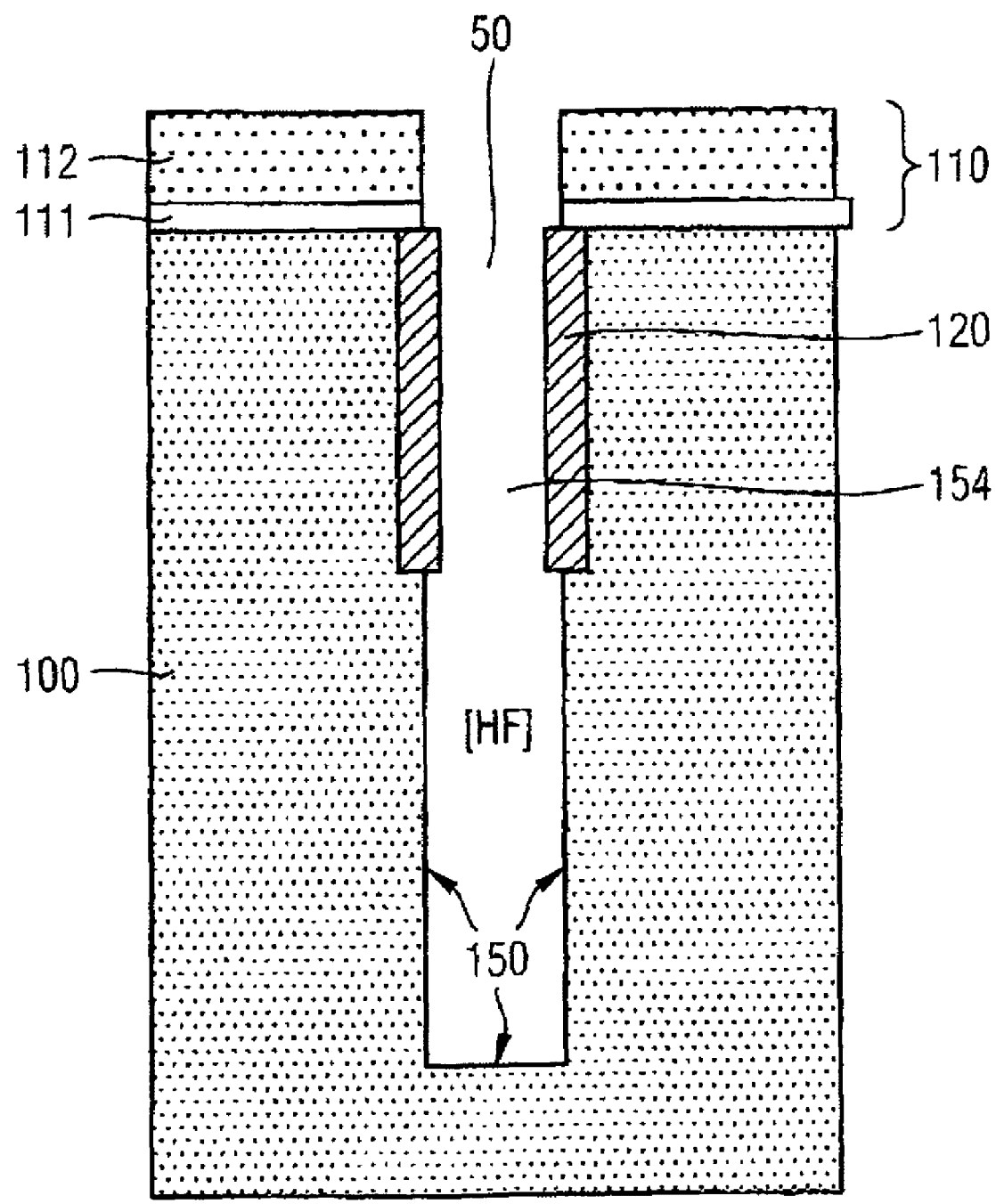
FIGS. 2–4 illustrate process steps of a known method for expanding a trench in a semiconductor structure.
Figure 3:
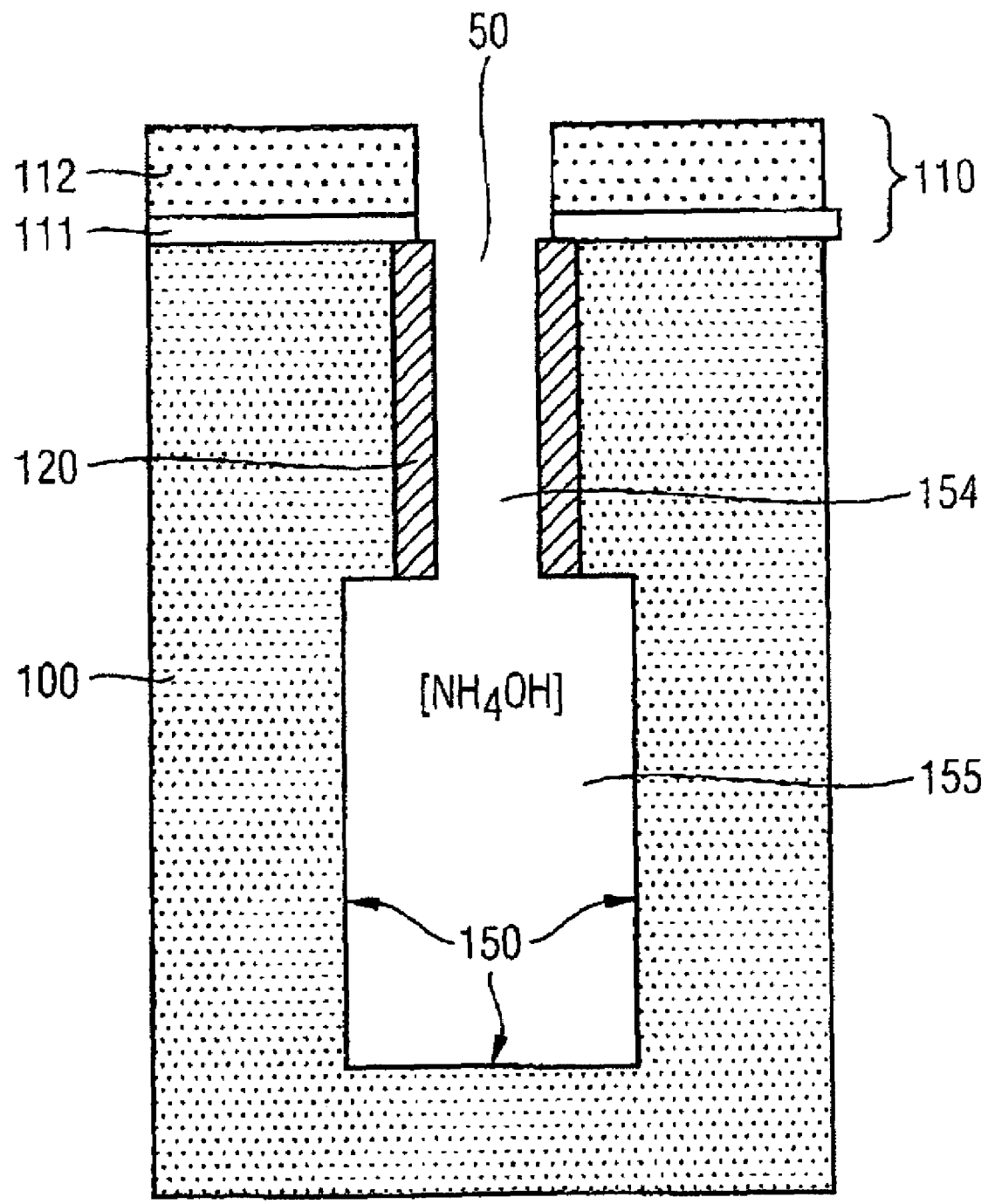
Figure 4:
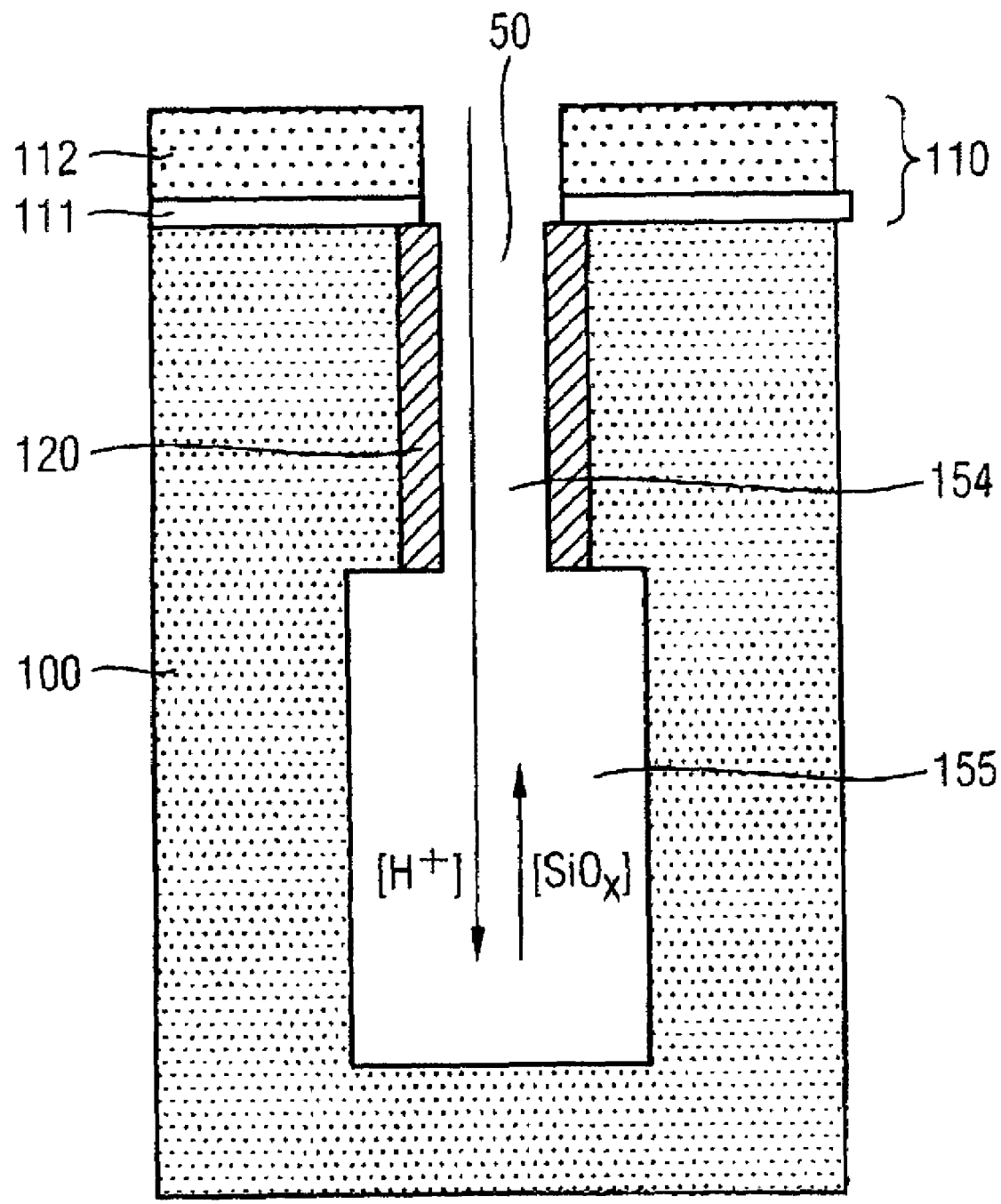

The embodiment of the present invention begins with the process steps in accordance with FIGS. 2 and 3 that have already been described above.

In contrast to the known process explained comprehensively above, in the case of the process according to the invention, after the trench 50 has been expanded by means of the alkaline $NH_4OH$ etching, an anodic passivation of the uncovered silicon surfaces by means of an $SiO_2$ layer 160 is performed. The alkaline stabilized $SiO_2$ can subsequently pass out of the trench 50 by diffusion before a negative pH shift occurs as a result of rinsing with water.

The anodic passivation is achieved for example by treating the relevant wafer in a single wafer reactor and applying to it an electrical potential which can be applied by means of a rear side contact, on the one hand, and by means of an inert electrode dipped into the etching solution, on the other hand.

The described etching process according to the invention typically lasts for 3 to 4 minutes, the stop time as a result of the anodic current pulse amounting to only a few seconds.

Consequently, it is possible to obtain a uniform silicon etching front in the entire trench 50.

The silicon oxide layer 160 on the etched surfaces 150 which is provided as a result of the anodic passivation may, if desired, be removed later in a short HF rinsing step after the water rinsing.

Although the present invention has been described above on the basis of preferred exemplary embodiments, it is not restricted thereto, but rather can be modified in diverse ways.

Although the lower trench region 155, which is expanded by the method according to the invention, has the substrate doping in the case of the embodiment described above, it is possible, of course, prior to the expansion method, to provide a buried plate in the substrate by indiffusion of a corresponding doping layer.

Moreover, the invention is applicable not just to an $NH_4OH$ etching, but to any alkaline etching in the course of which corresponding complexes are precipitated during rinsing.

Finally, the trenches to be expanded do not have to be trenches for trench capacitors, but rather may be, in principle, arbitrary trenches in a semiconductor structure which serve for microelectronic or micromechanical purposes.

What is claimed is:

1. A method for expanding a trench in a semiconductor structure, comprising:
   providing a trench in the semiconductor substrate;
   providing hydrogen-terminated silicon surfaces in the trench;
   anisotropic wet etching of the silicon surfaces in the trench with an alkaline etchant; and
   rinsing the trench with a proton-containing neutralizing agent for the removal of the alkaline etchant, wherein between the wet etching step and the rinsing step, an anodic passivation of the etched silicon surfaces in the trench is carried out, during which an etching stop layer is formed on the etched silicon surfaces in the trench.

2. The method according to claim 1, wherein the alkaline etchant is $NH_4OH$.

3. The method according to claim 1, wherein the neutralizing agent is $H_2O$.

4. The method according to claim 1, wherein the etching stop layer is a silicon oxide layer.

5. The method according to claim 1, wherein providing the hydrogen-terminated silicon surfaces in the trench is effected by means of an HF treatment.

6. The method according to claim 1, wherein the trench has an aspect ratio of at least 5:1.

7. The method according to claim 1, wherein the trench is expanded in a lower region and is masked in an upper region by means of an insulation collar for protection against the expansion.

8. The method according to claim 1, wherein the trench is part of a trench capacitor of a semiconductor memory device.

9. The method according to claim 1, wherein the etching stop layer is removed after the rinsing the trench.

10. The method according to claim 1, wherein the anodic passivation is formed by a current pulse that is significantly shorter than the etching time.

* * * * *